United States Patent [19]
Packard et al.

[11] 4,151,471
[45] Apr. 24, 1979

[54] SYSTEM FOR REDUCING NOISE TRANSIENTS

[76] Inventors: Thomas N. Packard, 4871 McDonald Rd., Syracuse, N.Y. 13215; Richard C. Burns, 216 Stratford St., Syracuse, N.Y. 13210

[21] Appl. No.: 848,576

[22] Filed: Nov. 4, 1977

[51] Int. Cl.² ............................................. H04B 1/10
[52] U.S. Cl. ................................. 325/473; 325/479; 328/165
[58] Field of Search ............... 179/1 P; 325/478, 479, 325/480, 348, 473, 474, 482; 328/165, 162, 168, 169, 171

[56] References Cited
U.S. PATENT DOCUMENTS

| 3,488,518 | 1/1970 | Taylor | 328/165 |
|---|---|---|---|
| 3,588,705 | 6/1971 | Loch et al. | 325/480 |
| 3,952,252 | 4/1976 | Cornacchia | 325/478 |
| 3,961,268 | 6/1976 | Hansen | 325/478 |
| 3,978,412 | 8/1976 | Frerking | 325/478 |
| 3,995,220 | 11/1976 | Hansen | 325/478 |
| 4,000,414 | 12/1976 | Hansen | 325/478 |
| 4,006,419 | 2/1977 | Liman | 325/478 |

*Primary Examiner*—William C. Cooper
*Assistant Examiner*—Randall P. Myers
*Attorney, Agent, or Firm*—D. Peter Hochberg

[57] ABSTRACT

A system for limiting the instantaneous value of a noise transient, by means of an electronic circuit wherein the amplitude of the total input signal being monitored is compared with a threshold value which is varied continuously according to the peak carrier signal value, and the output signal is maintained below the threshold value.

10 Claims, 5 Drawing Figures

SYSTEM FOR REDUCING NOISE TRANSIENTS

BACKGROUND OF THE INVENTION

1. Field of the Invention

The present invention relates to the transmission of electrical carrier signals, and to the recording and reproduction of sound, and in particular to the reproduction, and the rerecording and playback, of previously recorded sound signals.

2. Description of the Prior Art

In playing back a sound recording, one hears not only a reproduction of the original signal, but also the undesirable extraneous noise components that are caused by imperfections in the original recording and in the storage medium, damage to the storage medium, and inherent defects inadvertently introduced by the metal parts used in the manufacture of the storage medium. Such noises commonly are designated by such terms as "surface noise", "crackle", "ticks", etc. These noises are generally of a first type of an audibly continuous nature distributed fairly uniformly throughout the audio frequency range and known as "white" noise and of a second type which are transient sounds of short duration and high amplitude relative to the signal. (As used herein, the terms "input signal" or "carrier signal" refer to the electronic signal corresponding to the music, message or other sound intended to be transmitted to the listener or receiver; the term "noise transient" refers to the undesirable impulses and similar disturbances which may be imposed on the carrier signal; and the term "total input signal" refers to the total signal being transmitted—i.e. carrier signal plus noise).

Radio broadcast signals also may contain some additional noise components caused by disturbances in the transmission or reception, commonly called "static". Static, also, typically consists of pulses of short duration and high amplitude.

Previous processes in reducing unwanted noises in sound reproduction have relied on restricting the frequency range as far as is feasible for the purpose or application. Typically, the higher frequency components of the noise, usually referred to by such terms as "surface noises", "crackle", "ticks", etc. are suppressed throughout the playback, usually at some sacrifice to the fidelity of reproduction of the signal. Some sophistication in this process was introduced by Harmon H. Scott whose Dynamic Noise Suppressor used electronic means automatically to alter the frequency passband width in record reproduction in accordance with the loudness of the music. The Scott Suppressor takes advantage of the phenomena that the relative sensitivity of the ear to various frequencies varies with the loudness of the sound, and that louder passages of music and other audio signals have a correspondingly improved masking effect on the surface noise perceived from the recording; so that, in louder passages a wider frequency range is feasible in reproduction than is the case in the reproduction of the quieter passages for similar listening comfort and perceived tone quality. The operation of the Dynamic Noise Suppressor is, basically, a rather gradual one, especially in closing down the frequency range after loud passages, lest a too-evident change in background noise becomes audible. The Dynamic Noise Suppressor is incapable of suppressing transient noises save in a generalized manner by its relatively long-term modification of the pass band; it copes much more successfully with continuous "white" noise than with noises of a more pronouncedly transient nature. These same observations apply to such recent developments and extensions of the Scott principle as are embodied in U.S. Pat. Nos. 3,678,416 (Burwen) and 3,802,357 (Sachs). A different method of subjectively reducing noise is described in U.S. Pat. No. 3,275,326 (Welsh), in which two identical recordings playing simultaneously are auditioned.

Compressor-expander systems are well known in the art of sound recording and reproduction. These systems function by compressing the dynamic range in the recording process, and by expanding the dynamic range in the playback process to the extent that it had been compressed. The following U.S. Patents disclose various compressor-expander systems: U.S. Pat. Nos. 3,665,345 (Dolby), 3,729,693 (Dolby), 3,732,371 (Burwen), 3,813,559 (DeBoer), 3,815,039 (Fujisawa), 3,828,280 (Dolby), 3,829,715 (VanSluys), and 3,846,719 (Dolby). The systems are only effective for reducing noise in those sound recordings which are specifically pre-encoded for such systems.

Other assorted noise and signal reduction systems are disclosed in U.S. Pat. Nos. 2,736,711 (Hanson), 2,912,571 (Jacobson), 3,171,901 (Clemency), 3,394,235 (Schott) and 3,896,465 (Daizu).

There are also noise reduction systems known wherein noise transients are removed from transmitted signals by blanking operations wherein the entire signal is blocked from transmission for an interval intended to be co-extensive with a noise transient, and the charge on a capacitor replaces the signal during the blanking interval. Thus, U.S. Pat. No. 3,678,416 (Burwen) describes a circuit which utilizes a capacitor charged by low frequency energy from the input signal, and which substitutes the capacitor charge for the signal when a tick is detected; the duration of the blank being determined by the saturation delay of an amplifier in the control circuit; however, no provision exists for matching the instantaneous voltage on the capacitor with the instantaneous signal amplitude (signal plus noise) at either the initiation or termination of the blank. In U.S. Pat. No. 3,978,412 (Frerking), a switching device is described which "clamps" the audio signal for a predetermined blanking interval when a noise transient is detected, a blank is instituted and a capacitor engages to load down and replace the signal emanating from the noise detector. The latter switching device does not interrupt the signal transmission circuit.

We previously invented a system for reducing noise transients and filed U.S. patent application Ser. No. 686,107 on May 13, 1976 thereon. Our prior invention is concerned with suppressing only those noises in a carrier signal that are caused by discrete noise transients. Novel methods for suppressing these are incorporated in the system. One method takes advantage of the circumstance that imperfections in a recording, such as imperfections in the record material, defects in manufacture, damage, dirt, wear, mildew, etc. which may introduce transient noises into the reproduction of the recording, are not identical on opposite sides of the record groove, whereas the carrier signal is identical on opposite sides of the groove wall (when monophonic phonograph records are the medium wherein noise transients are to be reduced), save for such effects introduced in playback as tracing error, tracking error and "pinch effect" that turned out, in the application of our invention, to be of a second order nature. Our prior invention reduces transient noises in the reproduction of the recording by a continuous process of switching the reproduction to the one of the two groove walls having the quieter signal. An embodiment of our prior invention provides means by which the switching process can be between either of the groove side walls or the sum signal obtained by mixing the signals of the two side walls. Another method of suppressing transient noises in our prior invention comprises inserting a low pass or band pass filter in the transmission path for a predetermined length of time only long enough effectively to blank most noise transient.

There has recently been disclosed a system that suppresses noise transients by utilizing a time delay device and instituting a total blank for a time interval equal to or greater than the duration of the noise transient, starting at a zero crossing before the transient and concluding at a zero crossing sometime after a preestablished minimum interval. Various schemes for reducing impulse noises in audio signals, including impulse removal and splicing methods and the use of non-linear signal processors called "median filters", are discussed in Audio Engineering Society Preprint 1263, which is a report presented at the 57th Convention of the Audio Engineering Society, May 10-13, in 1977 in Los Angeles, Calif.

SUMMARY OF THE INVENTION

It is a general object of the present invention to eliminate noise transients from sound or carrier signals.

A further object is to provide apparatus for economically and effectively removing noise transients from sound signals. Yet another object is to provide improved apparatus for suppressing noise transients from sound signals emanating from such sources as phonograph recordings, radio transmissions, optical film recordings, sound tapes, and other sound signal carriers.

Further objects and features of the invention will be apparent from the following description and appended claims.

The blanking apparatus in the embodiment of the invention discussed below, detects noise transients and in response thereto institutes a blanking action that limits both positive and negative pulsations of a transient so that they do not exceed a threshold value established relative to the peak signal level occurring in a preestablished previous time interval. Its manner of operation has been so devised that it does not produce an appreciable audible signal.

DESCRIPTION OF THE PREFERRED EMBODIMENT

In the preferred embodiment of the invention described below, a blanking device for terminating transmission of the instantaneous input signal on a channel is actuated upon the detection of a noise transient, and the instantaneous value of the total input signal at the moment of blanking is substituted for the input signal until the instantaneous value of the total input signal returns to the substituted value, at which point the blanking function ceases. Thus, if a noise transient consists of several pulsations of alternating polarity, each separate pulsation is individually blanked as its instantaneous value achieves the threshold level. In this manner, the maximum amount of signal can be preserved or approximated. The detection of the noise transient and the actuation of a blanking device is accomplished by a circuit referred to as an enabling means. The enabling means is described in its preferred form as including a rectifier for rectifying the input signal, a peak detector for receiving the rectified signal and for detecting the peak carrier signal amplitude (without being affected by noise transients) during an interval; a peak voltage storage circuit for receiving and storing the peak carrier signal value during a subsequent interval; a control unit for amplifying the stored peak carrier signal value, the output of the control unit constituting a threshold reference signal which is a function of a recently occuring peak carrier signal amplitude, and for transmitting this output to a comparing means which compares the threshold reference signal with the total rectified input signal and generates a blanking command when the total input signal exceeds the threshold reference signal. In order to render the output of the peak detector substantially devoid of noise transients, another comparing means is provided for comparing the rectified total input signal to the threshold reference signal, and for actuating a discharge switch to clear the peak detector of its entire charge (including noise transients) when the input signal exceeds the threshold reference signal indicating the presence of a noise transient. In addition, means are provided for terminating transmission when the signal level falls below a predetermined magnitude.

Figure 1:
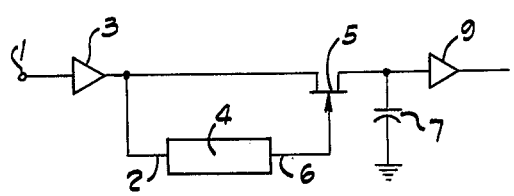
FIG. 1 is a schematic drawing of the preferred embodiment of a system according to the invention.

Referring to FIG. 1, a blanking system is shown which comprises an input terminal 1 of an amplifier 3 of low input impedance. The output of amplifier 3 is connected via a signal conducting path to a switch 5, and to the input terminal 2 of an enabling means 4. Switch 5 is located in an electrical line in which are connected a charge storage means, shown as a capacitor 7, and an amplifier 9. Switch 5 and capacitor 7 together form a blanking device whose output terminates at the input terminal of output amplifier 9. Amplifier 9 is selected to have an input impedance that is high enough to have a negligible discharging effect on capacitor 7.

The actual blanking operation is performed by the opening of switch 5 in response to a control signal from the output terminal of enabling means 4. The function of capacitor 7 is to hold the instantaneous value of the signal applied to the input of amplifier 9 at a constant value for the duration of the time during which switch 5 is open, wherefore it may be termed a signal substitution means.

Figure 2:
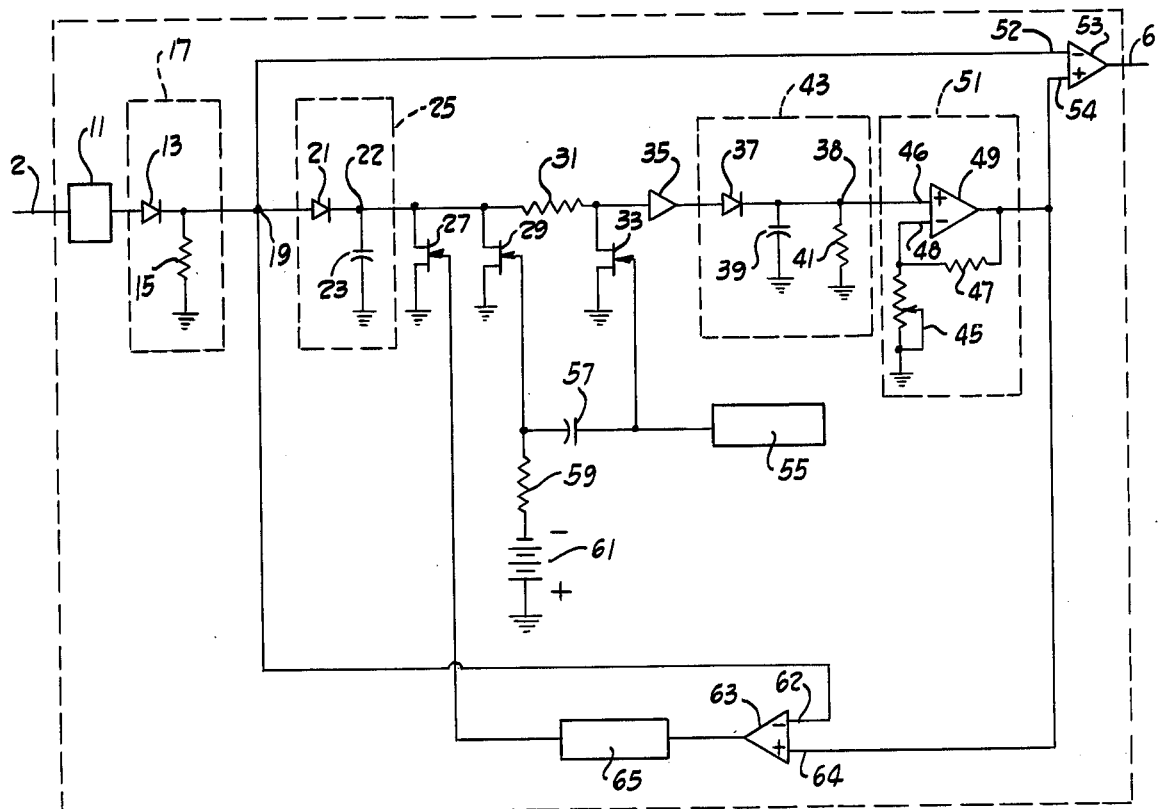
FIG. 2 illustrates a preferred embodiment of an enabling and control means for use in the system of FIG. 1.

Referring to FIG. 2, an enabling means of the type shown in FIG. 1 is shown to include a high pass filter 11 (having, for many contemplated applications, a corner frequency of 300 Hz and an attenuation rate of 6 decibels per octave) that receives its input signal from the output of amplifier 3 (FIG. 1). The output of high pass filter 11 is connected to the input of a full wave rectifying circuit 17 comprising a diode 13 and a resistor 15.

The rectified signal generated by rectifier circuit 17 which is in the form of a fluctuating, positively polarized voltage which follows the instantaneous value of the output signal of high pass filter 11, is applied to a junction 19 to which are connected a peak detector or peak voltage detector circuit 25, negative input terminal 52 of a comparator 53 and the negative input terminal 62 of a comparator 63. When the instantaneous value of the voltage applied to input terminal 52 of comparator 53 exceeds the bias introduced at the positive input terminal 54 of this same comparator, the comparator puts out a blanking command signal to switch 5. This causes switch 5 to open, triggering the blank. As soon as the instantaneous value of the voltage applied to input terminal 52 decreases to a condition of equality with the bias voltage applied at terminal 54, the output of the comparator 53 shuts off and switch 5 returns to its normally closed position, concluding the blanking operation.

Thus, the operation of the blanking function is controlled by the voltage differential existing between input terminals 52 and 54 of comparator 53.

The voltage applied to input terminal 54 of comparator 53 is proportional to, and may be less than or greater than, the charge accumulated in a peak voltage storage circuit 43, the operation of which is described below. The exact ratio of this proportionality is determined by the gain of a control unit 51, comprising a differential amplifier 49, a variable resistor 45 which serves as the sensitivity adjustment of control unit 51, and a resistor 47.

Peak voltage detector 25 includes a diode 21 and a capacitor 23 connected at a junction 22. Diode 21 allows the capacitor 23 to charge to the peak positive voltage value that occurs at juncture 19, provided that a first switching means such as switch 27 is open, and a second switch 29 forming part of a second switching means is also open. The output of the peak detector circuit, which appears at the juncture 22 is applied to a buffer amplifier 35 through a resistor 31, provided that switches 27, 29 and 33 are open (the latter switches comprising a second switching means).

The output of buffer amplifier 35 is applied to peak voltage storage circuit 43, comprising a diode 37, a capacitor 39 and a resistor 41. The output of this circuit, in turn, is applied to the positive input terminal 46 of differential amplifier 49. The output of unit 49 is applied to the positive input terminal 54 of comparator 53 and also to the positive input terminal 64 of comparator 63.

Switches 29 and 33 are triggered by an astable multivibrator or clock 55, that produces an asymmetrical square wave. This square wave is in its "high" state for an appropriate length of time, typically three milliseconds, during which switch 29 is open and switch 33 is closed. During this time interval, it is possible for capacitor 23 to charge, provided that switch 27 is open. But this charge is not transferred through resistor 31 to buffer amplifier 35 due to the closed state of switch 33, thus preventing transferral of the charge of the peak detector 25 to the peak voltage storage circuit 43. When clock 55 switches to its "low" state, in which it remains for a very short time interval, in the order of 0.1 millisecond or less, switch 33 opens and this enables the charge that has accumulated at point 22 to be transferred to juncture 38, the output of the peak voltage storage circuit 43, through resistor 31, buffer amplifier 35 and diode 37, the capacitance of capacitor 39 being of a small enough value to allow it to charge in this brief time interval.

When clock 55 changes from its "low" state to its "high" state, a positive voltage is applied to the RC circuit comprising capacitor 57 and resistor 59, causing a surge of current through the capacitor sufficient to cause switch 29 momentarily to close. This discharges capacitor 23 which, on the re-opening of switch 29, resumes charging to whatever peak potential may be applied to it by rectifier 21 during the following three milliseconds, provided that switch 27 is open. Voltage source 61 provides a bias sufficient to keep switch 29 normally open.

The function of switch 27 is to prevent the peak detector 25 from being charged by noise transients. Switch 27 is actuated by a pulse generator shown as a one shot 65, which puts out a control voltage for, typically, 0.6 millisecond when it is activated by a signal from comparator 63; comparator 63 and one shot 65 together form a switch operating means. This comparator has one input 62 connected to juncture 19, the output of full wave rectifier circuit 17.

The other input 64 of comparator 63 is connected to the output of control unit 51. At the occurence of a transient, the instantaneous voltage present at juncture 19 and applied to input terminal 62 of comparator 63, reaches a point where it exceeds in value the output of control circuit 51, which is applied to input terminal 64 of comparator 63. Under this condition, the output of comparator 63 applies a trigger signal to one shot 65, which closes switch 27 for 0.6 millisecond, thereby discharging capacitor 23. At the conclusion of the 0.6 millisecond time interval, switch 27 re-opens and capacitor 23 resumes charging to the peak level of the output of the full wave rectifier. An interval of 0.6 millisecond has been chosen as ticks on phonograph records seldom exceed this duration, but this interval can be changed when appropriate.

The sensitivities of comparators 53 and 63 need not be identical. In fact, it has been determined that optimum results are achieved when comparator 63 is less sensitive than comparator 53, thus creating frequently, in the operation of the device, the condition that comparator 53 is triggering a blanking operation on a minor transient while comparator 63 is not preventing the peak voltage of the minor transient from being stored in capacitor 23.

The function of resistor 41 is to provide a discharge path for capacitor 39. The discharge time constant, which is equal to the resistance of resistor 41 multiplied by the capacitance of capacitor 39, is typically of the order of 20 milliseconds.

Figure 3:
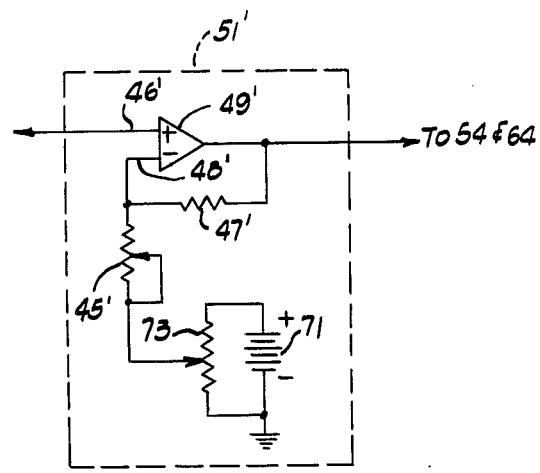
FIG. 3 illustrates a preferred embodiment of a squelching means which can be added to the enabling and control means illustrated in FIG. 2 for use in the system of FIG. 1.

An additional feature may be achieved by modifying control unit 51 as shown in the control unit 51' of FIG. 3, where like parts of control unit 51 have been ascribed like numerical designators with a prime (') suffix. Referring to FIG. 3, a positive adjustable voltage source is shown in series with the negative input terminal 48' of differential amplifier 49'. The variable voltage source is shown as a potentiometer 73 which is connected across a battery 71, with a variable resistor 45' functioning as a sensitivity control and connecting the variable arm of potentiometer 73 to the negative input of differential amplifier 49'.

The positive bias thus applied to input terminal 48' of differential amplifier 49' has an offsetting effect on the positive signal applied to the positive input terminal 46' by peak voltage storage circuit 43. This reduces the net positive output voltage of differential amplifier 49' and, for values of positive voltage bias at terminal 48' not in excess of the voltage at terminal 46' has an effect similar to that of the sensitivity control 45'. However, whenever the net positive voltage applied to input terminal 48' of differential amplifier 49' exceeds the positive voltage applied to terminal 46', the output of differential amplifier 49' assumes a negative value, thus applying a negative voltage to the positive input terminal 54 of comparator 53. Comparator 53 then assumes its "low" state (which corresponds to a blanking command) when the voltage differential between its input terminals 52 and 54 is such that terminal 52 is positive in polarity with respect to terminal 54. As the circuit design is such that terminal 52 cannot assume a negative value, it follows that application of a negative potential at terminal 54 causes the output of comparator 53 to assume its "low" state. Consequently, comparator 53 sends a blanking command to switch 5, causing it to open, thus preventing any further passage of signal through the switch until the input signal level is sufficient to charge peak voltage storage circuit 51 to the extent that the voltage applied to terminal 46' exceeds the bias applied to terminal 48', at which juncture the output of differential amplifier 49' again assumes a positive value. This, in turn, causes a positive bias to be applied to terminal 54 of comparator 53, thus restoring the circuit to its normal mode of operation and allowing switch 5 to close.

Figure 4:
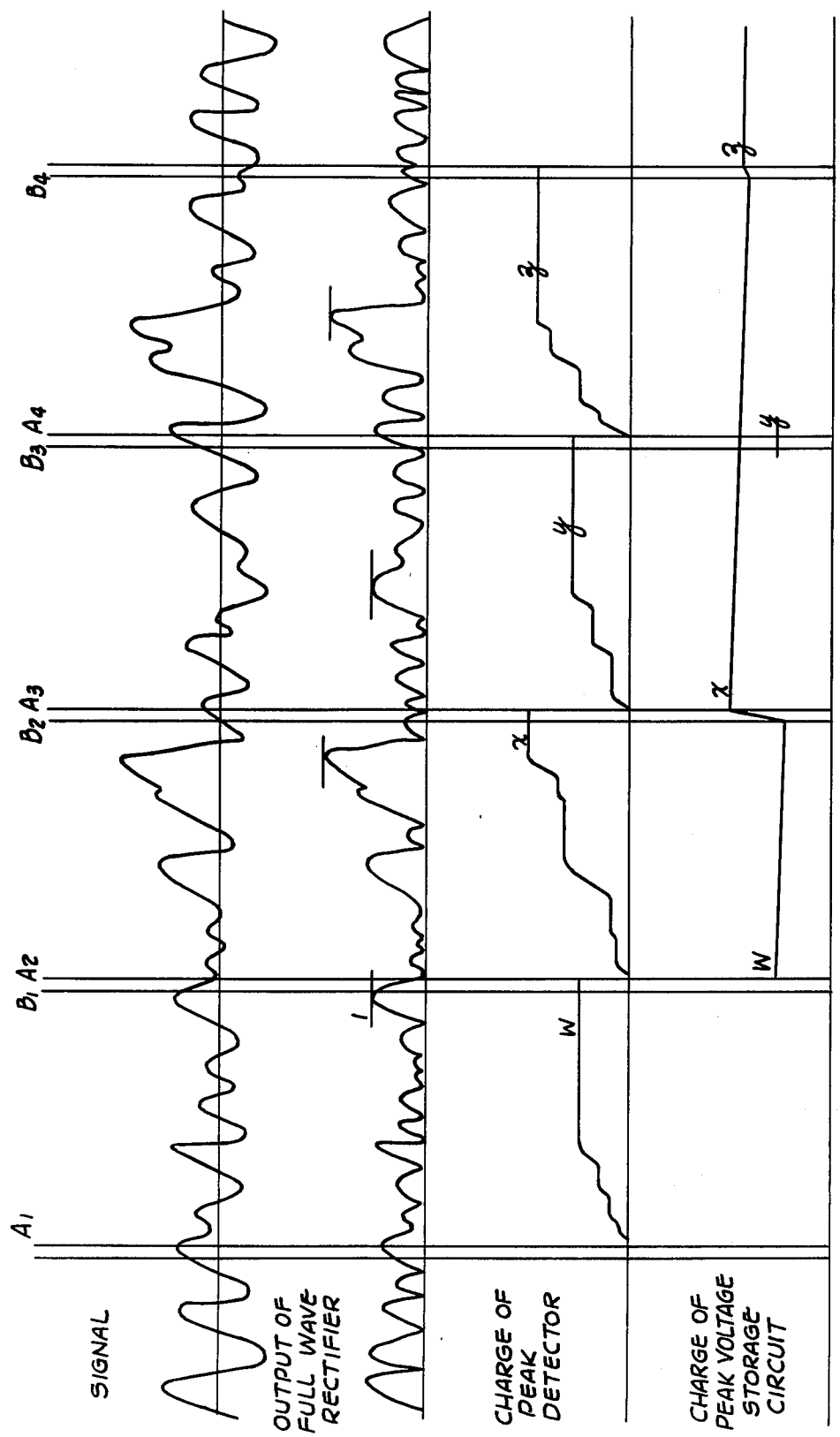
FIG. 4 is a graphical illustration of the signals occurring at different stages of the circuit shown in FIG. 2, during operation of the latter embodiment of the invention, in the absence of noise transients.

FIG. 4 shows in a diagrammatic manner the sequence of events in the operation of the blanker when there is no transient present in the signal.

The uppermost or first line shows a representation of a possible input signal. As no blanking occurs, due to the absence of any transient noise, the output signal is identical to the input signal, and therefor it is not separately illustrated in FIG. 4.

The second line in FIG. 4 shows the wave form achieved by processing the input signal through the full wave rectifier circuit.

The third line shows the buildup of charge on the peak detector circuit during each of the equal time intervals $A_1-B_1$, $A_2-B_2$, etc.

The bottom or fourth line shows the condition of charge of the peak voltage storage circuit.

The time intervals $A_1-B_1$, $A_2-B_2$, etc. are generated by clock 55, FIG. 2. These correspond to the "high" state of the clock output and are preferably of the order of 3 milliseconds in duration.

The time intervals $B_1-A_2$, $B_2-A_3$, etc. correspond to the "low" state of the clock output and are preferably in the order of 0.1 millisecond in duration.

In time interval $A_1-B_1$, the peak detector circuit charges to the peak voltage received from the full wave rectifier circuit in the course of this interval. This voltage is represented by w. The peak detector circuit holds this charge through the time interval $B_1-A_2$, during which interval it transfers its value to the peak voltage storage circuit, so that the peak voltage storage circuit starts time interval $A_2-B_2$ with charge w. This charge decays slightly during the interval due to the gradual discharging effect of resistor 41.

At the start of time interval $A_2-B_2$, the peak detector circuit 25 is discharged by the momentary closing of switch 29 shown in FIG. 2. Then it charges up to voltage x, the peak voltage occurring during this time interval. If, at time $B_2$, the voltage x exceeds the voltage stored in the peak voltage storage circuit 43, the stored charge is brought up to the value x during the time interval $B_2-A_3$.

At $A_3$ the peak detector circuit 25 is again momentarily discharged and then it charges to peak voltage y during the time interval $A_3-B_3$. Y is shown as a sufficiently low value such that, during the time interval $B_3-A_4$, it is less than the charge stored in the peak voltage storage circuit. In this case, the voltage y causes no increase of charge in the peak voltage storage circuit 43. Also, there is no discharge from the peak voltage storage circuit 43, as charge transfer occurs through rectifier 37, which effectively prevents any current from flowing out of the peak voltage storage circuit. Thus, throughout the next time interval, $A_4-B_4$, the peak voltage storage circuit 43 is at a charge determined by the discharge of voltage x through resistor 41.

Figure 5:
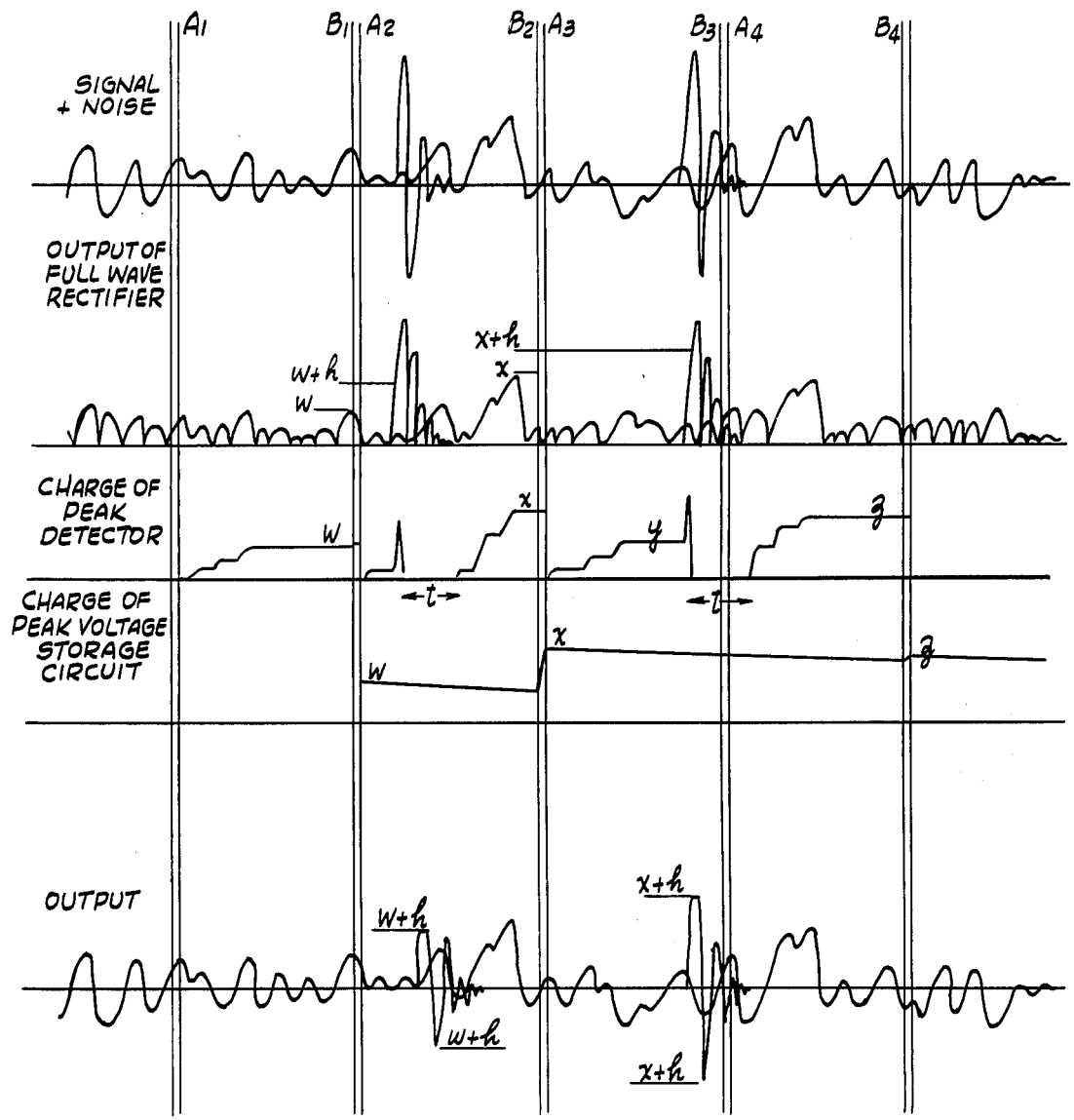
FIG. 5 is a graphical illustration corresponding to FIG. 4, showing the foregoing signals in the presence of noise transients.

FIG. 5 shows in a diagrammatic manner the sequence of events in the operation of the invention in the presence of noise transients. Two significant conditions of operation are illustrated: the first shows the action when the peak voltage detector has a chance to charge after termination of the transient; the second shows the action when the peak voltage detector does not have this chance.

FIG. 5 is drawn for the condition that switch 5 and switch 27 are always simultaneously actuated, as this allows some simplification of the drawing without compromising, in any way, the exposition of the principles of operation. As hereinbefore described, the sensitivity of comparator 63 is chosen to be less than that of comparator 53, so that minor transients cause switch 5 to open without causing switch 27 to close. And, in those conditions in which both switches 5 and 27 operate, switch 5 opens before switch 27 closes.

The first or uppermost line of FIG. 5 shows the same input signal as in FIG. 4 but with a noise transient superimposed in two places (in the $A_2-B_2$ period, and commencing in the $A_3-B_3$ period and extending into the $A_4-B_4$ period).

The second line shows the wave form achieved by processing the input signal plus noise through the full wave rectifier circuit 17.

The third line shows the buildup of charge on the peak voltage detector circuit 25 during each of the time intervals $A_1-B_1$, $A_2-B_2$, etc.

The fourth line shows the condition of charge of the peak voltage storage circuit 43.

The fifth or bottom line shows the output signal.

Starting at time $A_1$ the peak detector 25 receives its charge from the full wave rectifier 17, and that charge rises to voltage w by the conclusion of time interval $A_1-B_1$.

During time interval $B_1-A_2$, charge w is transferred to the peak voltage circuit 43, assuming this circuit was at a lower charge prior to $B_1-A_2$.

The peak voltage detector circuit 25 is discharged at $A_2$ and is then free to charge up from the output of the full wave 17, which it does until the instantaneous value of the total input signal achieves an amplitude w+h (w being the peak value of the signal in the time interval $A_1-B_1$, and h being the threshold value above or below the charge of peak voltage storage circuit 43 at which the blanking device triggers as determined by gain adjustment 45 of amplifier 49), at which juncture the transient is recognized and blanked. Upon recognition of the transient, switch 27 closes, discharging the peak detector 25.

After a time interval t, governed by the duration of the output signal of one shot 65, by which time the transient has concluded, switch 27 opens and allows the peak detector 25 to charge to value x.

Charge x is transferred during time interval $B_2$–$A_3$ to the peak voltage storage circuit 43, and this value acts to control the recognition of noise transients during the time interval $A_3$–$B_3$.

A second noise transient is diagrammed near the end of time interval $A_3$–$B_3$. It can be seen that, in this time interval, the voltage on the peak voltage detector 25 achieves the value y and then exceeds this value momentarily at the onset of the noise transient. Then switch 27 discharges the peak detector. Since the time remaining in time interval $A_3$–$B_3$ is less than the predetermined blank protection time t, the peak detector has no opportunity to charge before it is again time for it to transfer its charge to the peak voltage storage circuit 43. And, so, the peak voltage storage circuit continues to store charge x minus the small fraction of this value that has leaked off through resistor 41.

Thus it can be seen that the peak voltage storage circuit 43, which controls the level at which blanking occurs, does so by referencing from the peak voltage of the previous time interval, provided that operation is in an area of increasing peak voltage. If the peak voltage is in a decreasing mode, then the reference voltage is that of the peak voltage of the last preceding time interval during which voltage transfer had occurred less the amount that has bled off through resistor 41.

The invention described herein thus effectively reduces noise transients for sound signals in a manner which is not audibly discernible and does not impair the quality of the sound signal. The circuitry of the preferred embodiment is both practicable and economical and is effective in use.

The invention has been described in detail with particular emphasis on the preferred embodiment, but it will be understood that variations and modifications within the spirit and scope of the invention may occur to those skilled in the art to which the invention pertains.

We claim:

1. A system for reducing noise transients in a total input signal being transmitted over a channel, said total input signal including a carrier signal and noise transients, said system comprising:
   blanking means actuable for limiting the amplitude of the total input signal to reduce the amplitude of the noise transients;
   enabling means operatively associated with said blanking means for detecting noise transients in the total input signal and for selectively actuating said blanking means in response to the detection of a noise transient, said enabling means including:
   threshold establishing means for continuously establishing a reference threshold signal according to the peak carrier signal amplitude occuring at prior time intervals; and
   comparing means for comparing the total input signal with the reference threshold signal and for actuating said blanking means when the total input signal exceeds the reference threshold signal and for de-actuating said blanking means when the value of the total input signal decreases to a predetermined relationship to the reference threshold signal.

2. The invention according to claim 1 and further comprising:
   charge storage means for generating a signal into the channel during the actuation of said blanking means.

3. The invention according to claim 1 wherein said threshold establishing means comprises:
   peak detection means electrically connected to the channel for generating a first peak voltage signal corresponding to the maximum carrier signal amplitude occuring during a first period of time; and
   peak voltage storage means electrically connected to said peak detector means for receiving and storing the first peak voltage signal generated by said peak detector means, and for generating a second peak voltage signal after a second period of time subsequent to the first period of time; and reference threshold signal being a function of said second peak voltage signal.

4. The invention according to claim 3 and further comprising:
   control means electrically connected to said peak voltage means and to said comparing means and comprising amplifying means for amplifying said second peak voltage signal to generate the reference threshold signal.

5. The invention according to claim 4 wherein said amplifying means comprises means for amplifying said second peak voltage signal by a predetermined, variable amount.

6. The invention according to claim 3 and further comprising:
   rectifier means electrically connected to said channel for rectifying the total input signal and for transmitting as the input to said peak detector means the rectified total input signal.

7. The invention according to claim 3 and further comprising:
   first switching means, having a first mode for enabling said peak detector means to store signals corresponding to the carrier signal over an interval of time and a second mode for discharging stored signals from peak detector means; and
   switch operating means for operating said first switching means, said switch operating means including pulse generating means actuable to generate a pulse of predetermined duration for placing said first switching means into the second mode for said predetermined duration, and second comparing means for comparing the amplitude of the total input signal with the reference threshold signal; said second comparing means generating a trigger signal to actuate said pulse generating means when the amplitude of the total input signal exceeds said reference threshold signal to prevent said first switching means from storing noise transients.

8. The invention according to claim 3 and further comprising:
   second switching means operatively associated with said peak detector means and having a first mode for enabling said peak detector means to store signals impressed thereon and a second mode for effecting the transmission of said first peak voltage signals from said peak detector means to said peak voltage storage means and then discharging said peak detector means; and
   clock means operatively connected to said second switching means for generating a first timing signal to place said second switching means in the first mode for a predetermined period of time, and for generating a second timing signal to place said second switching means in the second mode for a predetermined period of time.

9. The invention according to claim 8 wherein said second switching means comprises:
- a first switch biassed to a normally open condition wherein said peak detector means is enabled to store signals impressed thereon; and
- a second switch biassed to a normally closed condition wherein said peak detector is disabled from transmitting stored signals to said peak voltage storage means;
- said first and second switches being operatively connected by a resistor-capacitor circuit, said resistor-capacitor circuit switching said first and second switches to assume their closed and open conditions, respectively, in response to the generation of said first timing signals by said clock means to transmit the first peak voltage signals to said peak voltage storage means and then to discharge said peak detector means.

10. The invention according to claim 9 and further comprising full wave rectifier means connected to the channel for rectifying the total input signal for transmission to said peak detector means; and wherein
- said peak detector means comprises a diode and capacitor means for receiving and storing carrier signals and;
- said peak voltage storage means comprises a resistor-capacitor circuit.

* * * * *